(12) United States Patent
Burke et al.

(10) Patent No.: US 6,790,598 B2
(45) Date of Patent: Sep. 14, 2004

(54) METHODS OF PATTERNING RESISTS AND STRUCTURES INCLUDING THE PATTERNED RESISTS

(75) Inventors: Cathie J. Burke, Rochester, NY (US); Diane Atkinson, Webster, NY (US); Mildred Calistri-Yeh, Webster, NY (US)

(73) Assignee: Xerox Corporation, Stamford, CT (US)

( * ) Notice: Subject to any disclaimer, the term of this patent is extended or adjusted under 35 U.S.C. 154(b) by 138 days.

(21) Appl. No.: 10/046,245

(22) Filed: Jan. 16, 2002

(65) Prior Publication Data

US 2003/0138741 A1 Jul. 24, 2003

(51) Int. Cl.⁷ .................................. G03F 7/22
(52) U.S. Cl. .................. 430/311; 430/394; 430/396; 430/397; 430/330; 430/5; 347/20; 347/71
(58) Field of Search ................. 430/394, 396, 430/397, 311, 330, 5; 347/20, 71

(56) References Cited

U.S. PATENT DOCUMENTS

| | | | |
|---|---|---|---|
| 5,344,748 A | 9/1994 | Feely | 430/330 |
| 5,485,181 A | 1/1996 | Convers | 347/63 |
| 5,699,094 A | 12/1997 | Burke et al. | 347/63 |
| 5,738,799 A | 4/1998 | Hawkins et al. | 216/27 |
| 6,294,317 B1 | 9/2001 | Calistri-Yeh et al. | 430/320 |
| 6,368,754 B1 * | 4/2002 | Imai | 430/5 |

* cited by examiner

*Primary Examiner*—John A. McPherson
*Assistant Examiner*—Daborah Chacko-Davis
(74) *Attorney, Agent, or Firm*—Oliff & Berridge, PLC

(57) ABSTRACT

Methods of patterning resists and structures including the patterned resists are disclosed. A patterned, multi-transmissive mask is used during patterning of resists to control exposure at areas of the resist at which features having different detail are desired. Exposure is varied in more finely patterned and more grossly patterned areas of the resist. The patterned resists have a high degree of topographical uniformity.

15 Claims, 4 Drawing Sheets

METHODS OF PATTERNING RESISTS AND STRUCTURES INCLUDING THE PATTERNED RESISTS

BACKGROUND OF THE INVENTION

1. Field of Invention

This invention relates to methods of patterning resists. This invention also separately relates to structures including the patterned resists.

2. Description of Related Art

Photolithography is used to form patterns in resists applied on substrates. Typically, radiation, typically light, is passed through a patterned mask to transfer the pattern of the mask into the resist. After development, the pattern exists in the resist.

Organic-based resists or photoresist include blends of polymeric and other organic and inorganic materials. The two broad classifications of resists are negative and positive working resists, which produce negative and positive images, respectively. In negative working resists, regions that are exposed to radiation, typically light, are polymerized and, consequently, more insoluble to a developer. Thus, the regions that are not exposed to light are more soluble to the developer and can be preferentially removed relative to the exposed regions during development. In contrast to negative resists, when regions of positive resists are exposed to light, they are chemically altered to exhibit a higher degree of solubility, so they can be preferentially removed relative to the non-exposed regions during development.

Photoresists have been used as structural layers in micromechanical devices, as described, for example, in S. Hagen et al., "Photosensitive Polyimide: Lithography in the Thick-Film Regime," *Proceedings 11$^{th}$ International Conference Photopolymers Principles, Processes, and Materials*, Society of Plastics Engineers, Inc., Oct. 6–8, 1997; incorporated herein by reference in its entirety.

Resist layers have been formed in ink jet print heads. Ink jet print heads include flow channels for flowing ink and nozzles for discharging ink droplets onto recording media to form images. Ink jet print heads include an energy source that applies energy to the ink to cause the ink droplets to be discharged out of the nozzles and onto the recording medium. Resist layers have been formed as permanent structural layers that define flow channels in ink jet print heads. See, for example, U.S. Pat. No. 6,294,317 to Calistri-Yeh et al.

Openings, or "features," can be formed in resists with various configurations. The openings can be generally round, rectangular or have other like shapes. The openings can also be relatively narrow and long. In such latter types of openings, the openings are defined by the side walls and bottom walls. The sidewalls can have different angular orientations relative to the upper major (planar) surface of the photoresist layers. For example, the sidewalls can be substantially perpendicular to the major surface to form substantially rectangular openings, known as lines or trenches. The sidewalls can alternatively be tapered relative to the major face. Lines and trenches can be either deep or shallow.

Another type of opening or feature formed in resists is an island. Islands are discrete upstanding structures that are generally parallel to each other. Islands have generally elongated shapes. Vias and other through openings can also be formed in resists.

The openings formed in resists can be characterized by their aspect ratio. The definition of the aspect ratio depends on the amount of taper of the sidewalls that define the opening. FIGS. 1 and 2 show two different opening configurations that have aspect ratios defined by respectively different relationships. FIG. 1 shows a photoresist layer 10 having an upper surface 12 and an opening 14 formed in the surface. The opening 14 has a height h and a width w. The height can be less than or equal to the thickness of the resist layer 10. The side walls 16 defining the opening 14 are perpendicular to the upper surface 12. For the opening 14 having such perpendicular side walls 16, the aspect ratio "A" can be defined as the ratio of the height "h" of the opening 14 to the width "w" of the opening 14, i.e. A=h/w. Thus, according to this definition, the aspect ratio "A" of an opening can be increased by increasing the height "h" at a constant width "w". It is common for the aspect ratio to be described according to this relationship.

FIG. 2 shows a negative resist layer 20 formed on a substrate 22. A mask 24 is positioned above the resist layer 20. The mask 24 includes openings 25 having a width "b" and separated from each other by a distance "a". The resist layer 20 includes an upper surface 28, a lower surface 30, and an opening 32 extending vertically between the upper surface 28 and the lower surface 30 and being aligned with the opening "b" in the mask 24. The opening 32 is defined by side walls 34, which are tapered relative to the upper surface 28, such that the width of the opening 32 varies from a width b' at the upper surface 28 to a width b" at the lower surface 30. The resist layer 20 has a width a' at the upper surface 28, and a width a" at the lower surface 30. For the opening 32 having such tapered side walls 34, the average aspect ratio "A" of the opening 32 can be defined as follows: A=2h/(b'+b"). Likewise, the average aspect ratio of the wall between the openings can be defined as A=2h(a'+a").

SUMMARY OF THE INVENTION

Methods that have been used to pattern resists, such as photoresists, have not been satisfactory. Namely, these methods have not produced satisfactory opening patterns including fine features with relatively higher aspect ratios in certain selected areas of the resist, and grossly patterned areas, with only little or even no detail, in other selected areas of the same resist layer.

Namely, in known methods of forming opening patterns in resists, a lesser amount of exposure to patterning radiation occurs in areas of resists where finer patterns are to be formed, due to proximity effects by the overlying mask. Areas of negative working resists at which finer patterned details are needed receive less exposure than more open areas and, consequently, remain more soluble, so that increased removal occurs during development of the resist. In contrast, more grossly patterned areas on the same resist, for example, areas having little or no detail, receive a greater amount of light exposure than the finer features, so that the exposed more grossly patterned areas become less soluble. Consequently, there is minimal removal of the more grossly patterned areas during development.

FIG. 3 schematically illustrates the relationship between the resist film thickness (resist film thickness=thickness of the resist film remaining after development/resist film thickness before exposure) versus the exposure dose or energy. As shown, the film thickness remaining after development versus the exposure dose increases rapidly at low exposure doses, and flattens out at high exposure doses. Lower exposure doses can be used to form higher aspect ratio features as compared to higher exposure doses. When exposure doses are high, even though fine areas of the resist receive relatively less exposure than coarse features using conventional mask patterns, the final resist film thickness after development is relatively uniform. However, when low exposure doses are used, to achieve resolution of finer features (i.e., features having relatively higher aspect ratios), the thickness of the resist remaining is on the steep slope portion of the curve. The differences in the exposure dose between resist regions including finer features and regions including coarser features, produces significant differences in surface topography in resists. In known patterning methods, significant post-patterning processing has been required to obtain a sufficiently flat surface under these conditions.

For example, as described above, resists have been used to form permanent structural layers that define ink flow channels and the like in ink jet print heads. Problems have occurred in methods of patterning resists that have been utilized in the manufacture of such devices. In a thermal ink jet print head, more finely patterned areas are typically located in the front (nozzle) portion of the print head, while more grossly patterned areas are typically located near the rear portion of the print head. However, in known patterning methods, to achieve the required resolution in the front portion of a thick resist film, the exposure energy at that portion is low, to achieve high-resolution imaging. During each exposure, the rear portion of the resist receives a greater exposure dose because the pattern is more open at the back portion. Due to the difference in exposure dose between the front and rear portions of the resist, the rear portion becomes greater in thickness relative to the front portion. As a result, the height of the rear portion is often much greater than the height of the front portion of the resist layer. In order to achieve a patterned resist having a substantially uniform surface topography, manufacturers have had to perform substantial post-patterning processing, requiring additional steps including chemical mechanical processing (CMP). Although the post-patterning processing improves the surface topography, it also increases manufacturing costs and significantly decreases product throughput.

Known photolithographic processes can only optimize for a regular feature pattern including either only wide features, or only narrow features, present in the same layer. However, these known processes are unable to optimize films that include both areas with finer features and areas with coarser features or no patterns in the same film. For such films, significant topography variations are produced between these different areas.

Thus, there is a need for a process that can achieve broad range of feature detail in the same resist film, with sufficiently uniform surface topography and without the need to also perform significant post-patterning processing.

In addition, some known photolithographic patterning methods have been unable to satisfactorily pattern features with aspect ratios greater than 1:1. Such difficulties have been especially prevalent in applications in which different portions of a resist film require different feature details, such as significantly different configurations and/or aspect ratios of features.

Thus, there is also a need for a process that can pattern features with high aspect ratios and with different aspect ratios in the same film.

This invention provides methods of making photopatterned structures that can satisfy the above-described needs, as well as other needs. Methods according to the invention can form resist films having different feature details, and with more uniform topography. Methods according to the invention can thus at least significantly reduce the need for post-patterning processing to correct for variations in topography.

In addition, exemplary embodiments of the methods according to the invention can form pattern features in resists that have high aspect ratios. The resists can be formed as single films. Moreover, embodiments of the methods according to the invention can provide patterned resists including features having aspect ratios that exceed the maximum aspect ratio typically obtainable using conventional lithographic processes on cured resists.

As described above, in some devices features having significantly different aspect ratios are needed in different portions of the same ink path. Accordingly, a resist film used in the fabrication of such devices should be capable of being patterned to form features, including higher-aspect ratio features, as well as features having a wide range of different aspect ratios, in a single film. Exemplary embodiments of the methods according to the invention can be used to form patterned resist films suitable for use in such devices.

In addition, methods according to the invention can be used to form patterned resist films for suitable for use in various different types of devices, including ink jet print heads, micro electro-mechanical systems (MEMS), and other devices.

This invention provides methods of manufacturing devices including the patterned resists.

This invention also separately provides structures and devices including the patterned resist films.

DETAILED DESCRIPTION OF PREFERRED EMBODIMENTS

Figure 1:
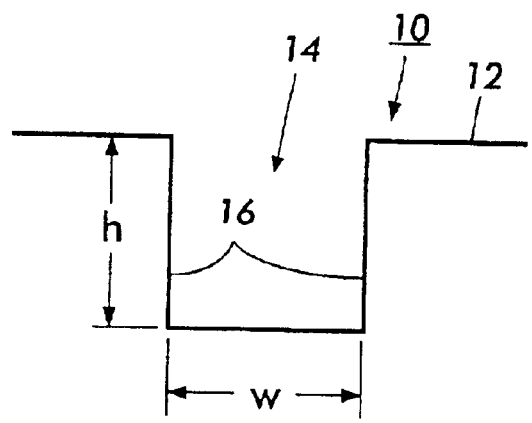
FIG. 1 is a schematic view of a resist film that includes vertical side walls.
Figure 2:
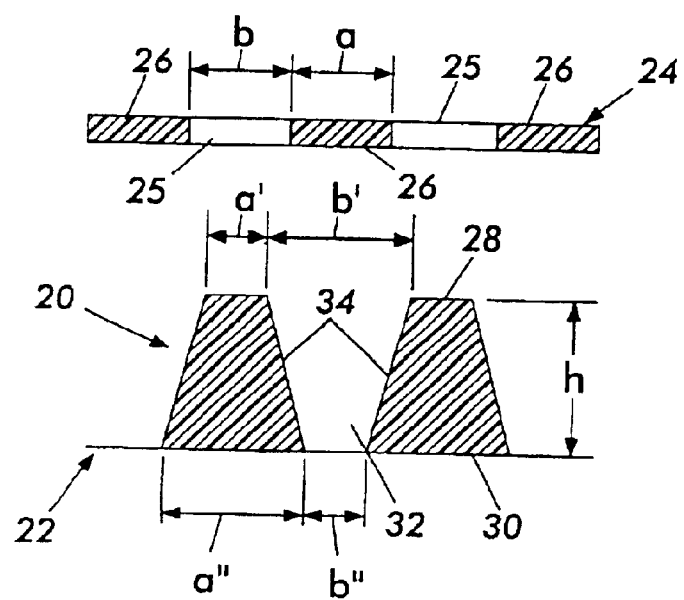
FIG. 2 is a schematic view of a negative resist including an opening having tapered side walls, and a mask positioned above the resist.

This invention provides methods of patterning resists. This invention also provides structures and devices produced by the methods.

To overcome the problems commonly associated with patterning resists to achieve a low degree of topographical variation, the invention provides methods of patterning resists that use a mask having selective transmissivity in different areas of the mask.

In exemplary embodiments of the methods according to the invention, a resist is applied on a substrate. The resist is typically an organic-based photoresist. The resist can be either a positive or negative working resist. For example, suitable resist materials include, but are not limited to, polyimides, polybenzoaxoles, polybenzocyclobutanes and polyarylene ether ketones.

The resist films can be formed to have any suitable final thickness after curing. In exemplary embodiments, the resist films typically can have a thickness of from about 5 microns to about 30 microns. The resist films are preferably formed as single layers to avoid problems associated with forming multiple-layer structures.

However, although less preferred, in some embodiments the resist films can be formed as multi-layer structures. In such multi-layer structures, the individual layers can each have the same or a different thickness than the layer of a single-layer structure.

In order to pattern the resist, a mask, also known as a photomask, is positioned between the resist and a radiation source. The mask used in embodiments of the methods according to this invention includes multi-transmissive portions. That is, the mask includes at least one portion or region that is partially transmissive to radiation and at least one portion or region that is transparent to the radiation. In addition, embodiments of the methods according to the invention can utilize a mask also including at least one portion or region that is opaque with respect to the radiation. The partially transmissive portion or portions of the mask can be used to pattern areas that are more grossly patterned or open, while the transparent portion or portions can be used to pattern higher resolution areas of the pattern. The opaque portion or portions can be used in areas of the pattern at which no features are formed.

The transparent portion(s) of the mask permit optimal exposure at those areas of the resist where finer patterns are desired to be formed. As a result, more finely patterned areas of the resist receive exposure to irradiating energy that results in less than substantially total thickness retention after development. Thus, for negative working resists, the more finely patterned areas of the resist that receive full exposure become less soluble. As a result, less resist removal and greater resist retention is achieved during subsequent etching steps.

The partially transmissive portion(s) of the mask permit limited exposure at areas of the resist at which more grossly patterned areas are to be formed. By limiting exposure in those areas of the resist, less resist is retained after development as compared to completely exposing the same areas. Therefore, by allowing at least limited exposure in the areas of the resist that are to be grossly patterned, some resist removal occurs upon developing those areas of the resist. Accordingly, the resulting topographical differences between the more grossly patterned areas and the more finely patterned areas of the resist can be significantly reduced as compared to standard photolithography techniques that do not use such selective exposure.

As described above, methods according to the invention are particularly advantageous for patterning resist films that require features having different aspect ratios within the same film. As described herein, according to the invention, the "finer features" that can be patterned in such resist films have a higher aspect ratio than the "more coarse features." Typically, the "finer features" can have an aspect ratio from about 1:1 to about 5:1. The "coarser features" have an aspect ratio that is significantly less than the aspect ratio of the corresponding "finer features." The coarser features typically have an aspect ratio of no more than about one-half of the aspect ratio of the corresponding finer features. However, the particular aspect ratios for the finer features and the coarser features are not limited. The methods according to the invention are particularly advantageous for patterning resists that include features having a large difference in their aspect ratios in the same film.

In addition, as described in greater detail below, finer and coarser features with significantly different aspect ratios from each other can be formed in different areas of the same resist film, with reduced topographical differences between the different areas.

In addition, according to the invention, features having two, three or even more different aspect ratios can be patterned in a given resist film, by appropriate selection of the mask.

According to embodiments of the invention, the transmissivity of selected portions of the mask can be at any desired level. For example, the transparent portion, or portions, of the mask typically have a transmittance of at least about 90%, and preferably about 100%. The partially transmissive portion, or portions, of the mask typically have a transmittance of from about 50% to about 90%, and preferably from about 70% to about 80%. The transmittance is chosen to compensate for the attenuation of the light due to proximity effects in the regions having finer features.

Furthermore, masks having generally two different transmittance values have been described above; however, other embodiments of the methods according to the invention are also provided. For example, in other embodiments, the mask can have at least one portion that is substantially or completely transparent (i.e., has a transmittance of at least about 90%), at least one portion that is partially transparent (i.e., has a transmittance of at least about 70%), at least one portion having a different partial transmittance, and at least one opaque portion that is substantially or completely non-transmissive. Other embodiments of the invention will be readily apparent to those having ordinary skill in view of the present disclosure.

Masks that are suitable for use in exemplary embodiments of the methods according to the invention are commercially available, such as from Canyon Materials, of San Diego, Calif. As stated above, the transmittance in the different portions of the mask can be varied as desired. Unlike a conventional mask, where areas are either opaque or transparent, areas on the masks used in the invention are selectively varied in degree of transmissivity.

By using a mask that has different transmittance values to expose regions of resists at which different feature details are desired, the amount of irradiation over the surface of the resist is sufficiently uniform to result in the topography of the patterned resist also being substantially uniform. In some exemplary embodiments, the topographical differences between more grossly patterned areas (or even non-patterned areas) and more finely patterned areas of resists can be less than about 5 microns, preferably less than about 1 micron, and most preferably less than about ½ micron over the wafer surface. Resists having such reduced topographical differences can be formed on substrate having various different sizes. For example, the resists can be formed and patterned on any conventional silicon wafers. For example, a 6-inch diameter silicon wafer can be used. Of course, the substrate can have various different shapes other than circular. For example, the substrate can be rectangular. The topographical difference over the resist surface can be measured by any suitable device. One such suitable device is a profilometer.

Exemplary embodiments of the methods according to invention can provide topographical differences between more grossly and more finely patterned areas of resists that are sufficiently small to at least significantly reduce, or even to substantially eliminate, the need for post-processing steps to reduce the topographical differences.

As described above, according to the invention, during patterning, a mask including multi-transmissive portions is positioned relative to the resist that is to be patterned, so that areas of the mask having a specific transmittance are positioned relative to the resist according to the intended level of exposure and/or detail that is desired in selected areas of the resist. Particularly, less transmissive regions of the mask are positioned above areas of the resist that are intended to receive lesser or even minimal exposure to produce more grossly patterned areas. More transmissive regions of the mask are positioned above areas of the resist that are intended to receive greater exposure to produce finer details having higher aspect ratios. Opaque portions of the mask are positioned above areas of the negative resist at which no resist retention is desired.

A radiation source is positioned so that the mask is between the radiation source and the resist to be patterned. The radiation source can be any suitable source, such as, for example, a mercury vapor lamp. Once the radiation source is positioned relative to the mask and the resist, the radiation source is activated so that radiation is emitted in the direction of the mask. The radiation is selectively blocked by the mask, or transmitted through the mask, by the mask regions that have different degrees of transmissivity. The light that is transmitted by the mask impinges on the underlying resist to expose the resist.

Once the resist has been selectively exposed to produce both more finely detailed and more grossly detailed areas, the resist is developed to remove the unexposed and unreacted portions of the resist to produce the desired pattern in the resist.

Finally, if necessary, post-patterning processing or polishing can be performed to achieve a desired level of topographical uniformity over the surface of the resist. However, as described above, embodiments of the methods according to the invention can at least significantly reduce, or even substantially eliminate, the need for such post-processing in order to achieve the desired topographical uniformity. Thus, any post-processing that may be performed is at most minimal.

Exemplary embodiments of the methods according to the invention can control the amount and location of impingement of radiation that reaches the resist, in order to form features that are much smaller than those that can be achieved using conventional photopatterning processes. For instance, in some exemplary embodiments of the methods according to the invention, feature sizes ranging from as small as about 2 microns in width to as great as about 3 cm in width can be formed in a resist film having a thickness of, for example, from about 5 microns to about 500 microns.

In addition, in some exemplary embodiments of the invention, one or more flood exposure steps can be incorporated into the photolithography method. Preferably, a flood exposure is conducted between two successive resist exposure and development steps. Flood exposure comprises uniformly exposing a resist structure from a previous masked exposure step without using any mask. The flood exposure step exposes the entire structure, and helps to reduce, and preferably minimize, differences in topography.

Embodiments of the invention can form openings, or features, having various shapes and sizes in photosensitized materials. The openings can be generally round, rectangular, circular, or can have various other shapes. The openings can be lines and trenches. In addition, embodiments of the invention can be used to form islands, vias and other suitable feature configurations, depending on the desired application.

Exemplary embodiments of the invention have been described above with respect to negative working resists. However, other embodiments of the methods according to the invention can utilize positive resist materials as well. The selection of a negative or a positive resist, as well as the composition and properties of the selected negative or positive resist, can be made depending on the details of the particular application, such as, for example, resolution, exposure equipment, chemical selectivity, film thickness and chemical requirements.

Figure 4:
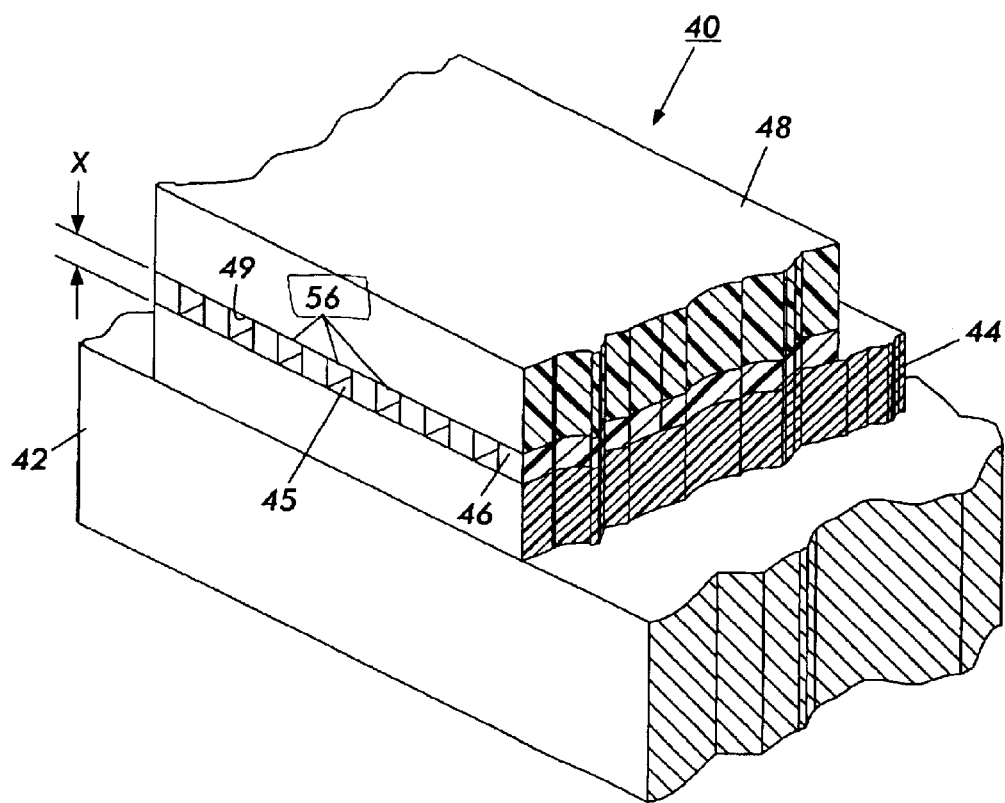
FIG. 4 is a schematic view of an exemplary embodiment of an ink jet head print head module including a patterned resist film produced by an exemplary method according to the invention.

Exemplary embodiments of the invention also provides structures and devices, including, for example, thermal ink jet print heads produced in accordance with the above-described methods. FIG. 4 is a schematic view of an exemplary embodiment of a portion of a thermal ink jet print head. The illustrated ink jet print head die module 40 includes a patterned film that can be formed by embodiments of the methods according to the invention. The thermal ink jet print head die module 40 includes a heat sink 42, a base or heater plate 44 over the heat sink 42, an intermediate layer 46 formed over the heater plate 44, and a cover or channel plate 48, formed over the intermediate layer 46.

The heater plate 44 comprises heating elements (not shown), which are activated to heat ink and cause ink droplets to be ejected from the nozzles 56. The heater plate 44 can comprise any suitable substrate material such as silicon, quartz, glass or ceramics. The heating elements can comprise any suitable resistive material.

Figure 5:
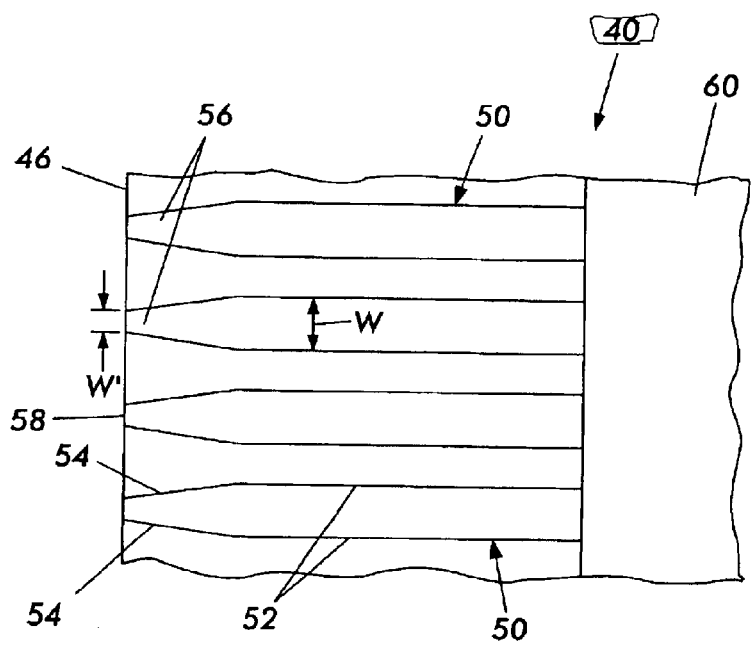
FIG. 5 illustrates an exemplary embodiment of a patterned resist film according to this invention.

The intermediate layer 46 has a thickness t. The intermediate layer can be formed of any suitable resist material. Referring to FIG. 5, channels 50 are formed in the intermediate layer 46. The upper surface 45 of the heater plate 44 forms a floor of the channels 50. The channels 50 include a portion having parallel side walls 52, and a portion including non-parallel side walls 54. The side walls 54 define nozzles 56 having open ends 58. Ink droplets are ejected from the open ends 58 of the nozzles 56 during operation of the ink jet print head die module 40. The intermediate layer 46 includes features configured to control the flow of ink through the channels 50 and other flow passages of the ink jet print head die module 40.

The lower surface 49 of the channel plate 48 forms a top of the channels 50. The channel plate 48 can comprise any suitable material that is resistant to the ink. For example, the channel plate 48 can comprise glass, quartz, plastics, silicon, metals, polymers, and/or ceramics.

The channels 50 communicate with an ink reservoir 60. The channels 50 have a height H. The height H of the channels 50 is measured in a direction perpendicular to the upper surface 45 of the heater plate 44. In the embodiment shown in FIG. 4, the channels 50 have a height H equal to the thickness t of the intermediate layer 46. In other embodiments, the height of the channels 50, as well as other features formed in intermediate layer 46, can be less than the thickness t.

As shown in FIG. 5, the channels 50 have a maximum width W at the portion of the channels defined by the side walls 52 and a minimum width W' at the open end 58. In accordance with the invention, the channels 50, and other features formed in the intermediate layer 46, can have high aspect ratios. For the channels 50, the aspect ratio is defined by the ratio of the height H to the width W, for embodiments in which the side walls 52, 54 are at least substantially vertical. The channels 50 have substantially constant width portions defined by the side walls 52. The angular range of the side walls 52, 54 is preferably substantially vertical (90°±5°). However, the side walls 52 and/or 54 can optionally be formed with tapered side walls.

According to the invention, features formed in the resist can have different heights or depths, as well as different aspect ratios, within the same layer. For example, in the intermediate layer 46 shown in FIG. 5, the aspect ratio of the channels 50 varies along the channel lengths. The channels 50 have an aspect ratio value that increases from that of the remainder of the channel 50 in the direction toward the open ends 58. At the location of the open ends 58, the flow cross-sectional area is significantly reduced and a high aspect ratio is obtained.

Figure 3:
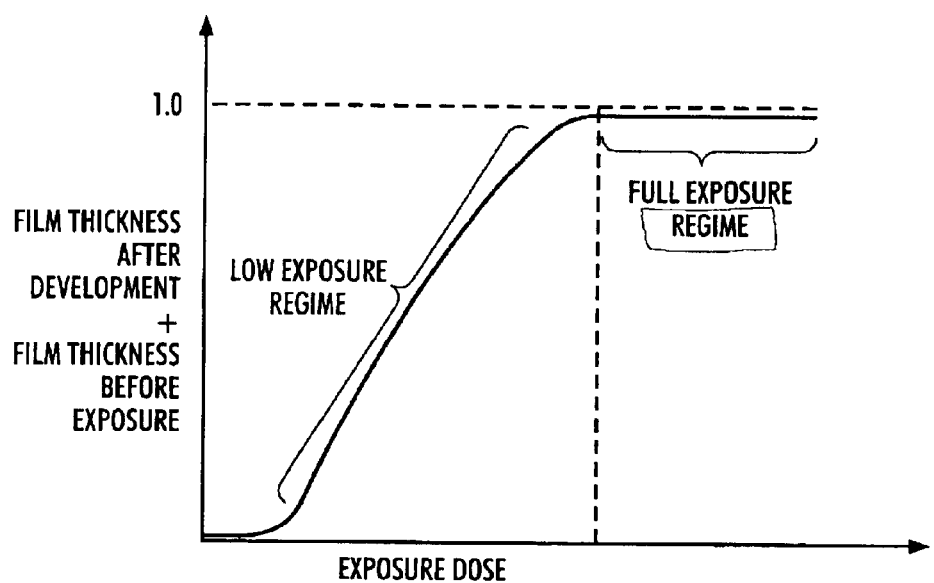
FIG. 3 is a curve illustrating the relationship between film thickness and exposure dose.

In the ink jet print head die module 40 shown in FIG. 3, the droplet volume is essentially controlled by the size of the open ends 58. The required droplet volume for different fluids, such as different colored inks, can be achieved by changing the size of the channel openings through which the different fluids respectively flow. The shape of the channels can control the firing frequency. The ability to form features having different aspect ratios enables the formation of channels having different sizes and shapes in the same intermediate layer 46.

Figure 6:
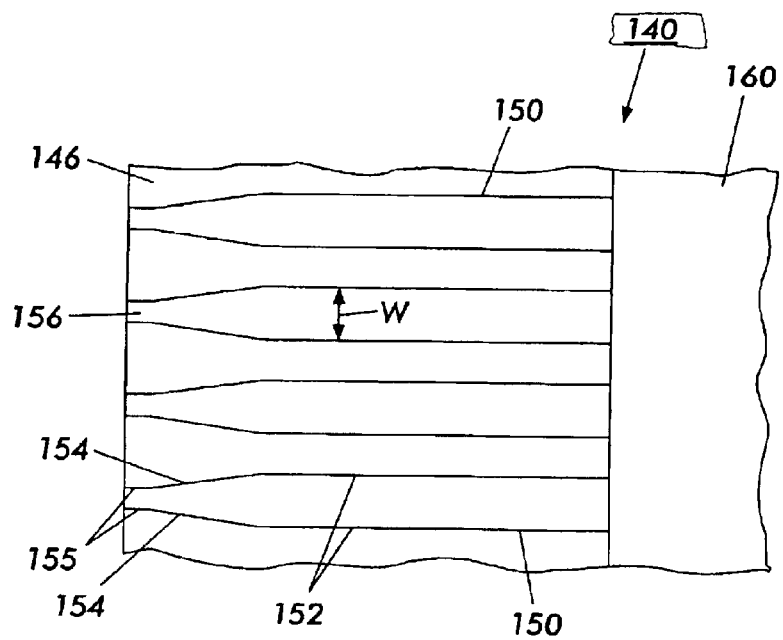
FIG. 6 illustrates another exemplary embodiment of a patterned resist film according to this invention.

FIG. 6 shows another exemplary embodiment of an intermediate layer 146 formed in an ink jet print head. In this embodiment, channels 150 are formed in the intermediate layer 146. The channels 150 each include a portion having parallel side walls 152, a portion having inwardly converging, non-parallel side walls 154, and a portion having parallel side walls 155 adjacent to the open ends 158. The side walls 154, 155 form nozzles 156.

In the intermediate layer 46, 146, the channels 50, 150 can have various different shapes and sizes. For example, the open ends of the nozzles can be square, rectangular, triangular, trapezoidal or circular shaped. In addition, other types of features than channels that may be formed in the intermediate layer can have various shapes and sizes.

Exemplary embodiments of the methods according to the invention can form the intermediate layer 46, 146 having substantially reduced topography between different areas of the intermediate layer. For example, the topographical difference between the front portion including the nozzles 56, 156 and the rear region including the ink reservoir 60, 160 can be substantially reduced to values of less than about 5 microns, preferably less than about 1 micron, and most preferably less than about ½ micron over the surface of the intermediate layer 46, 146. Consequently, in embodiments of the invention, the channel plate can be mounted on the top surface of the intermediate layer 46 without having to perform any significant post-patterning processing of the top surface. Because of the high level of flatness of the top surface of the intermediate layer 46 that can be achieved by methods according to the invention, the top surface of the intermediate layer and the bottom surface of the channel plate can fit closely together.

It will be readily understood by those having ordinary skill in the art that multiple patterned resist films formed according to the methods according to the invention can be formed in devices, such as an ink jet print head.

Thus, methods according to the invention can at least substantially reduce the need for post-processing techniques to reduce topographical differences over the intermediate layer surface. Regardless of the specific feature sizes and configurations produced using the methods according to the invention, the methods can substantially reduce manufacturing costs, while substantially increasing product throughput, by at least significantly reducing the amount of post patterning processing that may be desired.

For instance, exemplary embodiments of the methods according to the invention that form patterned resist films for use in a thermal ink jet print head, the overall manufacturing cost for the process can typically be reduced by between about 5% to about 100% as compared to the overall cost of manufacturing process that use conventional photopatterning techniques. In addition, the methods of the invention can increase product throughput of the process by from about 5% to about 200%, as compared to product throughput obtained using conventional photopatterning processes.

In addition, methods according to the invention can be used to form features in photopolymers with reduced topographical differences in other types of structures and devices. For example, structures can be formed in micro electro-mechanical systems (MEMS). Exemplary MEMS include systems that transport biological fluids through channels.

Furthermore, while the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. A method of patterning a resist, comprising:
providing a patterned mask comprising at least one transparent region, at least one partially transmissive region and at least one opaque region;
positioning the at least one transparent region of the mask over a first area of the resist at which first features having a first aspect ratio are to be patterned, the resist comprising a photopolymer;
positioning the at least one partially transmissive region of the mask over a second area of the resist at which second features having a second aspect ratio that is lower than the first aspect ratio are to be patterned;
emitting radiation onto and through the mask and onto a surface of the resist so that (i) the first area of the resist is exposed by radiation passing through the at least one transparent region of the mask, and (ii) the second area of the resist is exposed by radiation passing through the at least one partially transmissive region of the mask, wherein the mask controls the amount of radiation transmitted onto the resist to be substantially uniform over substantially the entire portion of the surface of the resist that is irradiated; and
developing the resist to pattern the first features at the first area and the second features at the second area of the resist.

2. The method of claim 1, further comprising using the mask to control the radiation transmitted onto the surface of the resist so that topographical differences between the first area and the second area of the substrate following development of the resist are from about 0.1 microns to about 5 microns.

3. The method of claim 1, wherein the resist has a thickness of from about 5 microns to about 500 microns.

4. The method of claim 1, wherein the first features have an aspect ratio of from about 1:1 to about 5:1, and the second features have an aspect ratio that is no more than about one-half of the aspect ratio of the first features.

5. The method of claim 1, wherein the first features and the second features include features that have a width of from about 2 microns to about 3 cm.

6. The method of claim 1, wherein the at least one transparent region of the mask has a transmittance of at least about 90%, and the at least one partially transmissive region of the mask has a transmittance of from about 50% to about 90%.

7. The method of claim 6, wherein the at least one transparent region of the mask has a transmittance of about 100%, and the at least one partially transmissive region of the mask has a transmittance of from about 70% to about 80%.

8. The method of claim 1, wherein the mask comprises a plurality of the transparent regions and a plurality of the partially transmissive regions.

9. The method of claim 1, wherein the resist is a negative resist.

10. A method of making an ink jet print head, comprising:

applying a resist comprising a photopolymer on a substrate;

providing a patterned, multi-transmissive mask comprising at least one transparent region, at least one partially transmissive region and at least one opaque region;

positioning the mask between a radiation source and the resist;

activating the radiation source so that radiation emitted from the radiation source is selectively transmitted by the at least one transparent region and the at least one partially transmissive region of the mask and impinges on a first area and a second area, respectively, of the resist, wherein the mask controls the amount of radiation transmitted onto the resist to be substantially uniform over substantially the entire portion of the surface of the resist that is irradiated; and developing the resist to pattern first features at the first area and second features at the second area, the first features having a first aspect ratio and the second features having a second aspect ratio that is lower than the first aspect ratio.

11. The method of claim 10, wherein:

the ink jet print head is a thermal ink jet print head;

the substrate is a heater wafer; and the method further comprises mounting a cover plate on the patterned resist, the first features and the second features providing ink flow channels in the thermal ink jet print head.

12. The method of claim 10, wherein the surface of the patterned resist that is irradiated has topographical differences between the first area and the second area after developing of from about 0.1 micron to about 5 microns.

13. The method of claim 10, wherein a cover plate is mounted on the patterned resist without performing any post-patterning processing to a surface of the resist that is irradiated by the radiation source and faces the cover plate.

14. The method of claim 10, wherein the mask comprises a plurality of the transparent regions and a plurality of the partially transmissive regions.

15. The method of claim 10, wherein the resist is a negative resist.

* * * * *